United States Patent [19]

Rao

[11] Patent Number: 5,737,233
[45] Date of Patent: Apr. 7, 1998

[54] VLSI CIRCUIT LAYOUT METHOD BASED ON SPREADING FUNCTIONS AND SIMULATED ANNEALING HEURISTICS TO MINIMIZE AREA

[75] Inventor: Satish B. Rao, Trenton, N.J.

[73] Assignee: NEC Research Institute, Inc., Princeton, N.J.

[21] Appl. No.: 583,296

[22] Filed: Jan. 5, 1996

[51] Int. Cl.$^6$ ..................................................... G06F 15/00
[52] U.S. Cl. ............................ 364/488; 364/489; 364/490; 364/491
[58] Field of Search ........................... 364/488–491

[56] References Cited

PUBLICATIONS

S. Kirkpatrick entitled, "Optimization by Simulated Annealing," J. Statis. Phy., 34:975–986, 1984.

C. Sechen et al entitled, "An Improved Simulated Annealing Algorithm for Row–Based Placement," Proc. IEEE Int'l. Conf. On Computer–Aided Design, pp. 478 to 481, Nov. 1987.

G. Even et al, entitled "Improved Approximations via Efficient Divide–and–Conquer," in the Proceedings on the Foundations of Computer Science 95, Oct. 1995.

S.N. Bhatt et al, entitled "A Frame for Solving VLSI Graph Layout Problems," JCSS, vol. 28, pp. 300 to 343, 1984.

C.E. Leiserson, entitled "Area–Efficient VLSI Computation," M.I.T. Press, 1983.

Primary Examiner—Emanuel Todd Voeltz
Assistant Examiner—Vuthe Siek
Attorney, Agent, or Firm—Philip J. Feig

[57] ABSTRACT

A VLSI circuit layout method includes defining a circuit to be designed in terms of a set of components V and a set of nets H connecting the components. A cost function is defined using a spreading function to define a cost of a VLSI circuit layout. A simulated annealing is applied to the cost function to produce a VLSI circuit layout having a minimal cost function. The resulting VLSI circuit layout requires minimal area.

8 Claims, 1 Drawing Sheet

VLSI CIRCUIT LAYOUT METHOD BASED ON SPREADING FUNCTIONS AND SIMULATED ANNEALING HEURISTICS TO MINIMIZE AREA

FIELD OF THE INVENTION

The present invention relates to a method of VLSI layout of circuits and specifically, to VLSI layout methodology based on spreading functions and simulated annealing heuristics to provide VLSI circuits using minimal area.

BACKGROUND OF THE INVENTION

Accurate and computable bounds of the VLSI layout area of circuits result in a useful tool. For example, in partitioning a circuit among modules, such a tool would be useful to quickly estimate the area of each submodule. A computable area bound is also useful for synthesizing circuits from high level descriptions.

In the book "Complexity Issues in VLSI: Optional Layouts for the Shuffle-Exchange Graph and Other Networks" by F. T. Leighton, M.I.T. Press, 1983, a novel method of proving lower bounds on the VLSI layout and crossing number was introduced. The method involves embedding a complete graph into the graph in question while minimizing the number of complete graph edges that pass through any edge. The technique was applied recursively to prove nontrivial lower bounds for networks such as the tree-of-meshes and the mesh-of-trees. While useful for proving theorems as well as providing intuition, the lower bounds have less utility since a lower bound in a particular circuit would still have to be hand engineered.

The present invention uses a method for automatically computing a lower bound based upon "spreading functions." Spreading functions can be viewed as an optimal but relaxed solution to a version of VLSI layout problem. The concept involved is that the spreading function provides lengths of the nets in the VLSI circuit where the components are located as they would be in a VLSI circuit layout.

In addition, there is a strong theoretical relationship between these spreading functions and tight lower bounding techniques for VLSI circuits provided by Leighton. Traditionally, compatible lower bounding techniques have been essential in providing solutions to difficult optimization problems such as VLSI layouts.

Spreading functions are intended to model the cost of embedding a graph in d-dimensional space. The use of spreading functions as a basis for an approximation algorithm is described in a paper by G. Even et al, entitled "Improved Approximations via Efficient Divide-and-Conquer", in the Proceedings on the Foundations of Computer Science 95, October 1995.

The use of graph decomposition frameworks for VLSI layouts is described in an article by S. N. Bhatt et al entitled "A framework for solving VLSI graph layout problems," JCSS, vol. 28, pp. 300 to 343, 1984 and in a doctoral dissertation by C. E. Leiserson entitled "Area-Efficient VLSI Computation," M.I.T. Press, 1983. These papers rely upon divide-and-conquer techniques for performing the graph problem. The preferred method disclosed herein for solving the graph problem does not rely on such divide-and-conquer techniques.

Simulated annealing refers to a heuristic local optimization procedure that solves problems by locally changing non-optimal solutions. In particular, the procedure evaluates how much a certain change in the current solution changes the solution cost. If the solution cost decreases, the change is made. If the solution cost increases, the change is considered with a probability determined by the magnitude of the change and a changing parameter called the "temperature." Simulated annealing is described in an article by S. Kirkpatrick entitled "Optimization by Simulated Annealing," J. Statis. Phy., 34:975–986, 1984. Simulated annealing has been proposed previously for VLSI layout in an article by C. Sechen et al entitled "An improved simulated annealing algorithm for row-based placement," Proc. IEEE Int'l. Conf. on Computer-Aided Design, pp. 478 to 481, November 1987.

SUMMARY OF THE INVENTION

The present invention uses a simulated annealing approach that incorporates the spreading function into the energy function that the simulated annealing heuristic attempts to minimize.

Consider the representation of a circuit by a hypergraph C=(V, H) where V is the set of components and $H \subseteq 2^{|V|}$ represents the set of nets. That is, h={1, 2, 3}∈H corresponds to a net that connects components 1, 2, and 3. For example, it is possible to use simulated annealing to produce a layout that minimizes $\Sigma_{h \in H} c(h)/l(h)$ where l(h) is the value assigned to h by an optimal spreading function and c(h) is the cost assigned to h in the resulting layout. It will be apparent to those skilled in the art that it is possible to use other energy functions that combine the lengths in the layout and the values obtained from the spreading function.

A sequence of nets $\Pi=\{h_1, h_2, \ldots h_k\}$ in H is a u-v path if $\{u, x_1\} \subseteq h_1, \{x_1, x_2\} \subseteq h_2, \ldots, \{x_{k-1}, v\} \subseteq h_k$. That is, $\Pi$ is a u-v path if the nets in $\Pi$ can be used to connect components u and v. The length of $\Pi$ under l(.) is defined as $\rho_{h \in H} l(h)$.

A two-dimensional spreading function on a graph G=(V, E) is a metric function d: E→I with minimal $\Sigma_{e \in E} l(e)$ such that for all S⊆S, $$\sum_{u,v \in S} l(u,v) \geq (S-1)^2 f(S),$$

$f(S)=S^{1/2}$ and l(u, v) is the minimum length under l(.) of any u-v path. The term $\Sigma_{h \in H} l(h)$ will hereinafter be referred to as the volume of the function d(.). The constraints in the equation will be referred to as spreading constraints. The spreading problem is to find a spreading function of minimum volume.

That is, a two-dimensional spreading function corresponds to an assignment of net lengths where each subset of k components has at least as large as a diameter as if they were embedded in a two-dimensional grid, i.e., on a VLSI chip.

The volume of the minimum volume spreading function serves as an estimate of the sum of net lengths of an VLSI layout of the circuit. The lengths assigned to nets serve as an estimate of the lengths of the net in a physical design of the circuit. Moreover, the spreading problem can be approximately solved very efficiently for even very large circuits. Thus, the result is a fractionally very nearly optimum, yet computable, solution to the VLSI layout problem.

The spreading function is useful theoretically in the following context. Consider the problem of producing a one-to-one embedding of the nodes of a graph into a 2-dimensional mesh where the sum of the lengths of the edges is minimized. Such a mapping is referred to as a geometric embedding of a graph. For a geometric embedding of a graph, it is possible to produce a spreading function by simply assigning a distance to an edge of the graph that corresponds to the distance between its endpoints in the embedding. Thus, the spreading function provides a natural lower bound for the geometric embedding problem. This is the context in which spreading functions are used in Even et al. The result is an approximation algorithm for the geometric embedding problem based on spreading functions.

The present invention uses the spreading function to assist in guiding heuristic layout programs for VLSI. In particular, a spreading function will assign long lengths to nets that are required to be long. Thus, a heuristic layout program such as simulated annealing could intelligently allow these edges to be long in order to minimize the total length of the remaining edges.

The invention will be more clearly understood when the following description is read in conjunction with the accompanying drawing.

BRIEF DESCRIPTION OF THE DRAWING

The sole FIGURE is a flow chart of a preferred method of practicing the invention.

DETAILED DESCRIPTION OF THE INVENTION

Figure 1:
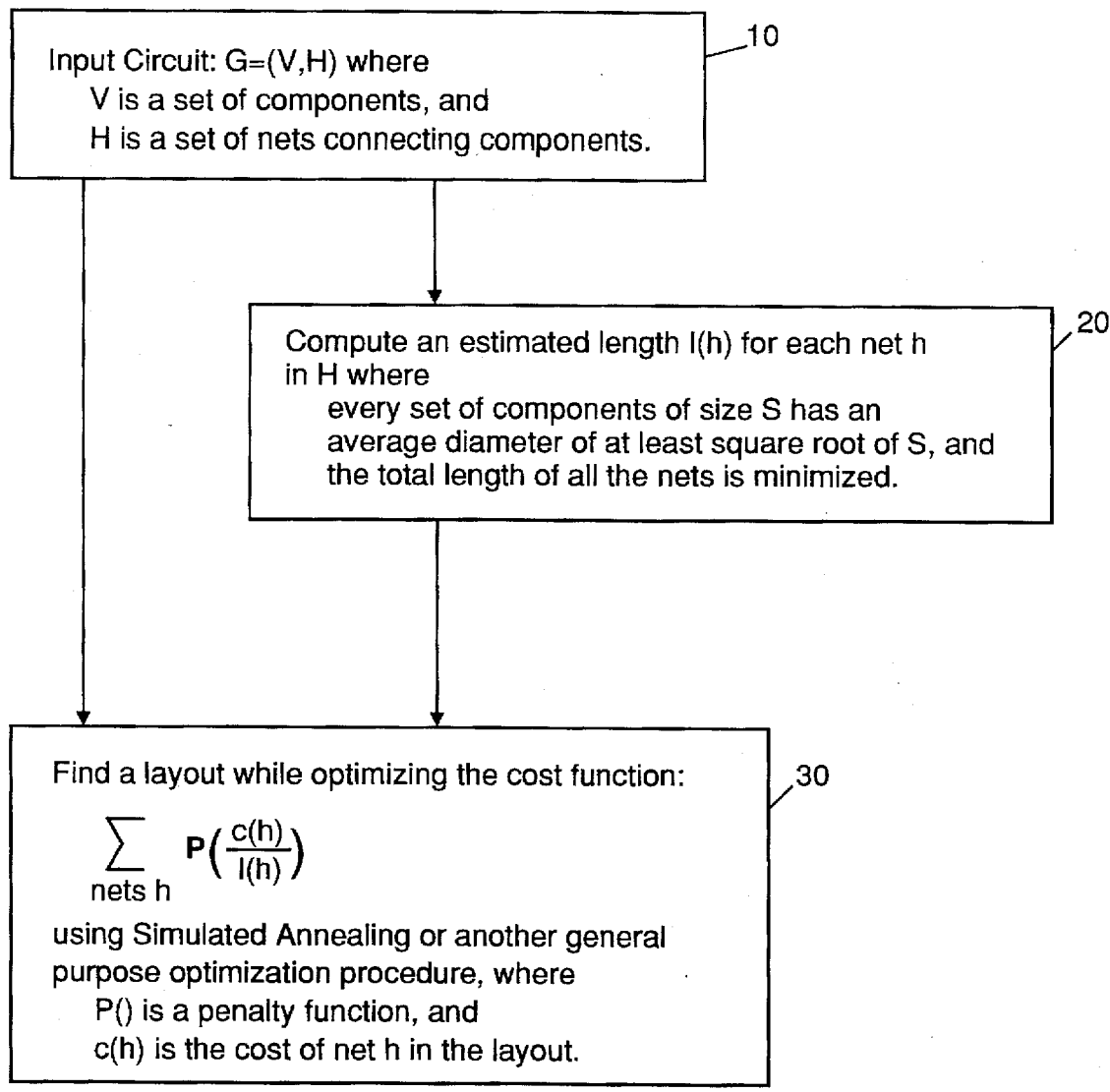

Referring now to the sole FIGURE of the invention, there is shown a flow chart of the method of practicing the method of laying out a VLSI circuit. The circuit to be laid out is defined 10 in terms of a set of components V and a set of nets H connecting (interconnection) components.

Next, an estimated length l(h) is computed for each net h in the set of nets H 20 where every set of components of size S has an average diameter of at least the square root of S and the total length of all the nets h ($\Sigma$/heH l(h)) is minimized. That is, $$\sum_{u,v \in S} l(u,v) \geq (S-1)^2 f(S)$$

where $f(S) = S^{1/2}$ l(u, v) is the minimum length under l(.) of any u-v path. That is, the average distance between any pairs of components in S is large.

The layout is selected 30 by optimizing the cost function $$\sum_{nets\ h} P\left(\frac{c(h)}{l(h)}\right)$$

where P( ) is a penalty function and c(h) is the cost of net h in the layout. The penalty function is $P(x) = cx^{(1+\epsilon)}$ for a given constant c, where $0 < \epsilon < 1$, where $\epsilon$ approaches 1 for a fully custom VLSI design and $\epsilon$ approaches 0 for a simple gate array design. The cost function depends upon the application, for example, whether the application is fully custom design, a gate array design or field programmable gate array design. The cost function is selected empirically for the particular application. The cost function is preferably related to the total length of a minimum spacing tree connecting the terminals of the nets.

The VLSI layout itself is derived from applying simulated annealing to find a layout with a small value for the cost function in box 30. The addition of the spreading function lengths to this cost function, allows the simulated annealing program to yield a physical design for a VLSI circuit that uses less area than the circuit designs that are produced by simulated annealing with traditional cost functions. The primary reason is that simulated annealing traditionally produces locally minimum solutions that can be quite different from an optimal solution. The fractionally optimal guidance that the spreading function provides on the structure of a solution allows the simulated annealing program to perform more effectively.

Having described a method of VLSI circuit layout, it will be apparent to those skilled in the art that variations and modifications are possible without deviating from the broad principle and spirit of the present invention which shall be limited solely by the scope of the claims appended hereto.

What is claimed is:

1. A method of optimizing a VLSI circuit layout comprising the steps of:

defining a circuit to be designed in terms of a set of components V and a set of nets H connecting components;

finding a length l(h) for set h in the set of nets H, where every set of components V of size S has a diameter of at least the square root of S and the total length $$\sum_{h=1}^{H} l(h)$$

is minimized;

heuristically finding a layout that has a minimal value of $$\sum_{nets\ h} P\left(\frac{c(h)}{l(h)}\right),$$

where P(.) is a penalty function and c(h) is the cost of net h in the layout, where $P(x) = cx^{(1+\epsilon)}$ for a given constant c, and where c is preferably close to 1, and $0 < \epsilon < 1$, by simulated annealing to determine a VLSI circuit layout; and laying out the VLSI circuit to be designed in accordance with the determined VLSI circuit layout.

2. A method of optimizing a VLSI circuit layout as set forth in claim 1, where said cost function is dependent upon the application of the VLSI circuit to be designed.

3. A method of optimizing a VLSI circuit layout as set forth in claim 2, where the value of $\epsilon$ approaches 1 for a fully custom VLSI circuit and the value of $\epsilon$ approaches 0 for a simple gate array design.

4. A method of optimizing a VLSI circuit layout as set forth in claim 1, where said estimated length l(h) is computed by solving the equation $$\sum_{u,v \in S} l(u,v) \geq (S-1)^2 f(S)$$

where $f(S) = S^{1/2}$ and l(u, v) is the minimum length under l(.) of any u-v path.

5. A method of optimizing a VLSI circuit layout comprising the steps of:

defining a circuit to be designed in terms of a set of components V and a set of nets H connecting components;

defining a cost function by use of a spreading function to define a cost of a VLSI circuit layout, where the cost function is $$\sum_{nets\ h} P\left(\frac{c(h)}{l(h)}\right)$$

and where l(h) is the estimated length for each set h in a set of nets H, where every set of components of size S has a diameter of at least the square root of S and the total length of all the nets is minimized, where c(h) is the cost of net h in the layout, where P(.) is a penalty function of $P(x)=cx^{(1+\epsilon)}$, and where c is a constant close to 1, and $0<\epsilon<1$;

applying simulated annealing to the cost function to produce a VLSI circuit layout having a minimal cost function; and laying out the VLSI circuit in accordance with the produced VLSI circuit layout.

6. A method of optimizing a VLSI circuit layout as set forth in claim 5, where said finding a length l(h) is computed by solving the equation $$\sum_{u,v \in S} l(u,v) \geq [(|S|-1)^2 f(|S|)]$$

$(S-1)^2 f(S)$ where $f(S)=S^{1/2}$ and l(u, v) is the minimum length under 1(.) of any u-v path.

7. A method of optimizing a VLSI circuit layout as set forth in claim 5, wherein said cost function is dependent upon the application of the VLSI circuit to be designed.

8. A method of optimizing a VLSI circuit layout as set forth in claim 7, where the value of $\epsilon$ approaches 1 for a fully custom VLSI circuit and the value of $\epsilon$ approaches 0 for a simple gate array design.

\* \* \* \* \*